(12) United States Patent
Maurer et al.

(10) Patent No.: US 6,501,781 B1
(45) Date of Patent: Dec. 31, 2002

(54) ARRANGEMENT FOR ALIGNING THE LIGHT BEAM PATHS OF A GROUP OF LASER DIODES ON A COMMON SPOT, ESPECIALLY FOR PROVIDING PUMPING LIGHT FOR A SOLID STATE LASER

(75) Inventors: Dieter Maurer, Backnang (DE); Lars Bartelt-Berger, Oppenweiler (DE); Heiner Hauer, Fellbach (DE); Albrecht Kuke, Auenwald (DE); Eberhard Moess, Murrhardt (DE)

(73) Assignee: Robert Bosch GmbH, Stuttgart (DE)

( * ) Notice: Subject to any disclaimer, the term of this patent is extended or adjusted under 35 U.S.C. 154(b) by 0 days.

(21) Appl. No.: 09/372,303

(22) Filed: Aug. 11, 1999

(30) Foreign Application Priority Data

Aug. 25, 1998 (DE) .......................... 198 38 518

(51) Int. Cl.[7] ............................. H01S 3/091; H01S 3/04
(52) U.S. Cl. ........................................... 372/75; 372/36
(58) Field of Search ............................... 372/75, 50, 36, 372/70, 69, 99

(56) References Cited

U.S. PATENT DOCUMENTS

| 4,411,057 A | * | 10/1983 | Duda et al. ................... 372/36 |
| 4,807,238 A | * | 2/1989 | Yokomori ..................... 372/36 |
| 4,881,237 A | * | 11/1989 | Donnelly ..................... 372/50 |
| 4,956,844 A | * | 9/1990 | Goodhue et al. ............. 372/99 |
| 5,557,475 A | | 9/1996 | Nightingale et al. .......... 372/75 |
| 5,793,792 A | * | 8/1998 | Baxter et al. ................. 372/36 |

* cited by examiner

Primary Examiner—Quyen Leung
(74) Attorney, Agent, or Firm—Michael J. Striker

(57) ABSTRACT

The arrangement focuses a combined laser beam (33) composed of individual laser beams produced by laser diodes (2) on a common spot. Prismatic reflecting bodies (7,8) are arranged in depressions (11,12) provided in a common substrate (1) between parallel rows (R1,R2; R3,R4) of the laser diodes (2). Each reflecting body (7,8) has oppositely inclined reflecting surfaces arranged on opposite sides thereof for deflection of the individual laser beams from the two adjacent rows of laser diodes. Two cylindrical lenses (9) are arranged on opposite sides of each reflecting body (7,8) between the laser diodes and the reflective surfaces to convert elliptical remote fields of the laser beams into circularly symmetric remote fields. Laterally movable focusing lenses (14) for each individual laser beam are arranged on the reflecting bodies (7,8) between the common spot and the reflecting surfaces for individual adjustment of the laser beams, whereby the combined laser beam (33) is focussed on the common spot.

12 Claims, 3 Drawing Sheets

ARRANGEMENT FOR ALIGNING THE LIGHT BEAM PATHS OF A GROUP OF LASER DIODES ON A COMMON SPOT, ESPECIALLY FOR PROVIDING PUMPING LIGHT FOR A SOLID STATE LASER

BACKGROUND OF THE INVENTION

1. Field of the Invention

The present invention relates to an arrangement for aligning both light beam paths or both light beams of at least two laser diodes on a common spot.

2. Prior Art

In an especially effective process for pumping a solid state laser semiconductor laser diodes (LD) whose emission spectrum is substantially narrower than that of conventional lamps are used instead of the conventional lamps. The semiconductor laser diodes (LD) are selected so that the wavelengths of their emission spectrum coincide exactly with the pumping light wavelengths for the solid state laser to be pumped. According to the state of the art several different arrangements of the laser diodes in relation to the solid state laser crystal to be pumped are conventionally employed.

In the transverse arrangement the pumping light is radiated across or transverse to the laser beam of the solid state laser in the laser crystal. This sort of coupling has the advantage that many pumping laser diodes can be arranged over the length of the laser crystal and thus the total pumping power and thus also the laser power can be increased. The laser system is scalable in regard to its power, i.e. the laser power grows in proportion to the number of laser diodes arranged along the length of the laser crystal. However it is disadvantageous that the entire cross section of the laser crystal is irradiated by the laser light. Pumping power is lost in that portion of the laser crystal in which no laser light is produced. On the other hand, excitation of the higher transverse modes, which are not desired in those applications in which laser radiation in the transverse fundamental TEM00 mode is required, is permitted by a too large cross section of pumped laser material.

In the longitudinal pumping arrangement the pumping light is coupled in the direction of the laser beam of the solid state laser to be pumped. With this sort of excitation the pumping light may be exactly concentrated in the volume in which the laser light travels. Because of that the pumping efficiency of the coupling between the pumping light and the laser light is substantially improved in relation to the transverse coupling and on the other hand a smaller cross section can be pumped so that only the transverse fundamental mode TEM00 is excited. The possibilities for pumping light. coupling by means of a greater number of pumping light sources are however considerably limited in comparison to the transverse pumping arrangement. The pumping light can be coupled in via the front and/or rear laser mirror. At least one of the laser mirrors is made with a dichroic reflective surface, that is its surface is reflecting for laser light and transparent for pump light. In a plate-like laser crystal, in which the laser light is reflected in a crooked or folded beam path at the lateral surfaces of the crystal, also the pumping light can be coupled in from there in the direction of the laser beam, in as much as the reflections at these locations are not total reflections. The coupling locations or positions for the pumping light must have a dichroic coating.

Since the polarization direction of the light is not of significance for the pumping effect, two pumping light sources with crossed polarization directions can be combined with respective polarization radiation combining devices at the respective coupling locations. This arrangement of pumping light sources however results in considerable expense because of the required coupling optics and beam combining devices, which must be arranged around the entire periphery of the laser crystal. Proposals have however already been made in the art regarding how to avoid these disadvantages. Those proposals take advantage of the fact that slight variations in the beam propagation parameters of the pumping light and the laser light are possible, since the pumping light is strongly absorbed in the laser crystal in contrast to the laser light, so that most pumping energy is absorbed in the focused region when the pumping light is focused in the laser crystal. Because of that it is possible that several laser diodes can send a beam in via one of the above-mentioned pumping light entrances. It is presumed however that the individual laser beams have only very slight variations in their irradiation directions and in their irradiated points. Difficulties occur because the required high power pumping laser diodes have a strongly elliptical beam portions with a width of typically 100 $\mu$m and a height of typically 1 $\mu$m and correspondingly they propagate with elliptical radiation characteristics with a vertical spreading of typically 40° and a horizontal spreading of 10°. For beam formation cylindrical or anamorphotic image-forming components are required because of the elliptical nature of the laser beam. According to the state of the art different proposals were made for these purposes (see e.g. U.S. Pat. No. 5,557,475) with complicated spatial arrangements of mirrors and prisms. The individual beams of the pumping laser diodes guided together can be then either coupled directly into the laser crystal or coupled by means of optical fibers with stepped profiled cores and sufficient core diameter ($\geq 200\mu$m) and guided into the laser crystal. It is disadvantageous that a large number of complicated optical components must be used which must be mounted and adjusted in three dimensional space with a high accuracy and which require expensive mounting devices for a stable assembly.

SUMMARY OF THE INVENTION

It is an object of the present invention to provide an arrangement for aligning the beam paths of respective laser beams of a group of laser diodes on a common spot, especially for pumping a solid state laser.

According to the invention the arrangement for aligning beam paths of respective laser beams from at least two laser diodes on a common spot includes means for providing a bend in each beam path between the laser diode producing the laser beam traveling along that beam path and the common spot, a respective cylindrical lens provided in each beam path between the laser diode and the bend associated with that beam path, a respective focusing lens provided in each beam path between the bend and the common spot associated therewith, means for laterally moving at least one focusing lens, advantageously all of the focusing lenses, for adjustment of the beam path in which the focusing lens or lenses are arranged, so that the beam paths converge on the common spot and a common supporting substrate on which the laser diodes, the cylindrical lenses and the focusing lenses are mounted.

The arrangement according to the invention avoids the disadvantages of the prior art and provides a simple and automatic adjustment and assembly of the laser diodes, especially pumping laser diodes and their associated optical components.

Further advantageous features are set forth in the dependent claims appended hereinbelow and are described in the following detailed description.

BRIEF DESCRIPTION OF THE DRAWING

The objects, features and advantages of the invention will now be illustrated in more detail with the aid of the following description of the preferred embodiments, with reference to the accompanying figures in which:

FIG. 3b is a cross-sectional view through the portion of the device shown in FIG. 3a;

The same parts in different figures are provided with the same reference numbers.

DESCRIPTION OF THE PREFERRED EMBODIMENTS

Figure 1:
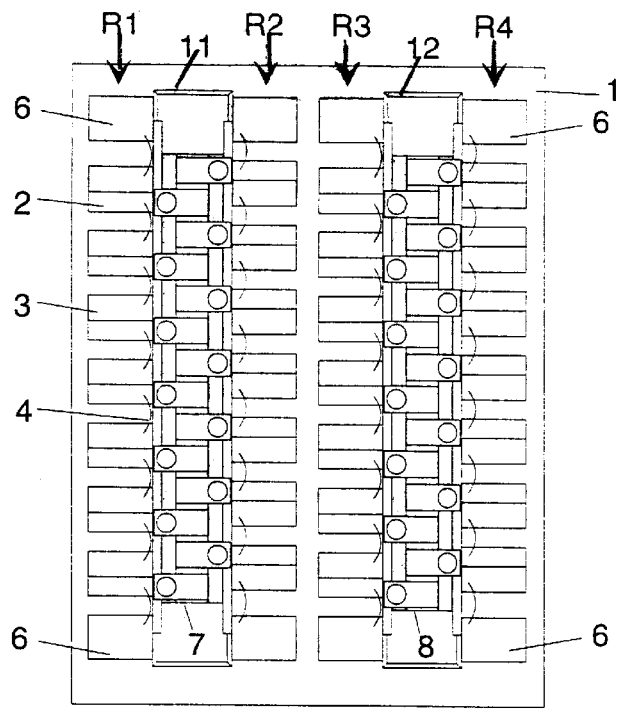
FIG. 1 is a plan view of an arrangement of laser diodes, especially pumping laser diodes, according to the invention.
Figure 2:
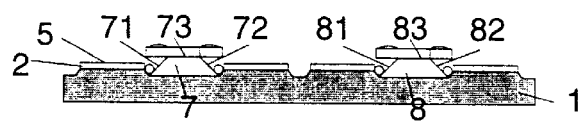
FIG. 2 is a cross-sectional view through the arrangement shown in FIG. 1.

FIG. 1 shows an arrangement of a group of laser diodes, especially pumping laser diodes, according to the invention, while FIG. 2 shows a cross-sectional view through the same arrangement. Laser diodes 2 are arranged in up to four rows R1 to R4 side-by-side on a supporting substrate 1, which is made of a material with good thermal conductivity for dissipating the heat generated during operation. In order to provide an electrical contact the laser diodes 2 rest with their bottom connecting sides on respective contacting layers 3. Each contacting layer 3 is larger than the base surface of the laser diode contacting it and is insulated from the supporting substrate 1, in case this substrate is made from an electrically conductive material. The laser diodes 2 can be electrically connected in this manner in series. The series connection of the laser diodes occurs by means of a bonding connection of the upper surfaces of the contacting layers 3, on which the laser diodes 2 are mounted. The connections of the laser diodes 2 at the ends of each row are made on connecting surfaces 6 to which current is supplied from an unshown electrical circuit (not shown here). In an alternative embodiment not shown here it is possible to connect all the laser diodes 2 in one row in parallel when suitable conductor strips for current supply are provided for the upper contacting surfaces on the supporting substrate 1 The supporting substrate 1 can be the base of a housing (not shown in FIGS. 1 and 2) that houses the entire arrangement of pumping laser diodes in a hermetically sealed environment, so that it is protected from environmental influences and thus its service life and reliability are increased. Similarly the supporting substrate 1 can be soldered on the base of this sort of housing. In both cases the dissipated heat can be conducted to a large surface area heat sink under the housing bottom with little heat resistance and thus an impermissible temperature increase of the pumping laser diodes can be avoided.

In the embodiment shown in FIGS. 1 and 2 four rows R1 to R4 of laser diodes are arranged side-by-side with seven laser diodes 2 in each row. The laser diodes in rows R1 and R2 propagate beams in opposite directions to each other. The same is true of the laser diodes 2 in rows R3 and R4. A prismatic reflecting or mirror body 7 is arranged between rows R1 and R2 and another prismatic reflecting body 8 is arranged between rows R3 and R4. The reflecting bodies 7,8 are provided with mirror surfaces 71,72, 81, 82 on their lateral surfaces that are inclined at 45° to a flat surface of the supporting substrate 1 The light from the rows R1, R2, R3 and R4 laterally impinging on these mirror surfaces 71, 72, 81 and 82 is deflected upwardly. With the laser diodes mounted so that the light outlet surfaces face down as shown (episide down), the mirror surfaces must extend under the bottom side of the laser diode chips. The laser diodes can be soldered on an intermediary support which is mounted on the supporting substrate 1 and which is not shown here, or the prismatic reflecting bodies 7 and 8 are mounted in depressions 11 and 12. If crystalline silicon is chosen as the material for the supporting body 1, the depressions 11 and 12 can be made by known anisotropic etching methods. The reflecting bodies 7,8 can be connected by known anodic bonding process with the supporting substrate 1. Other process for structuring the depressions 11 and 12 (for example stamping, erosion or milling) and for attaching the reflecting bodies (for example gluing or soldering) can be employed.

Figure 3A:
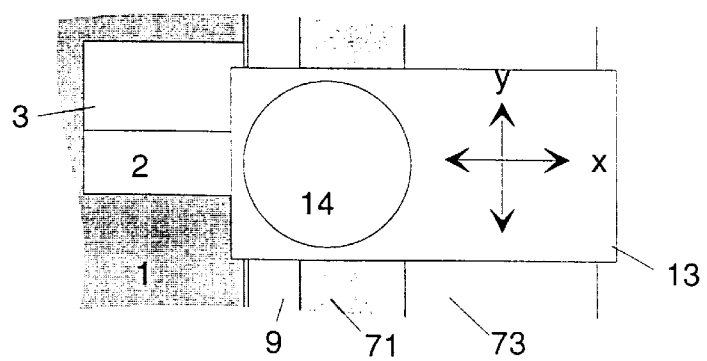
FIG. 3a is a detailed cutaway plan view of a portion of the device shown in FIG. 1.
Figure 3B:
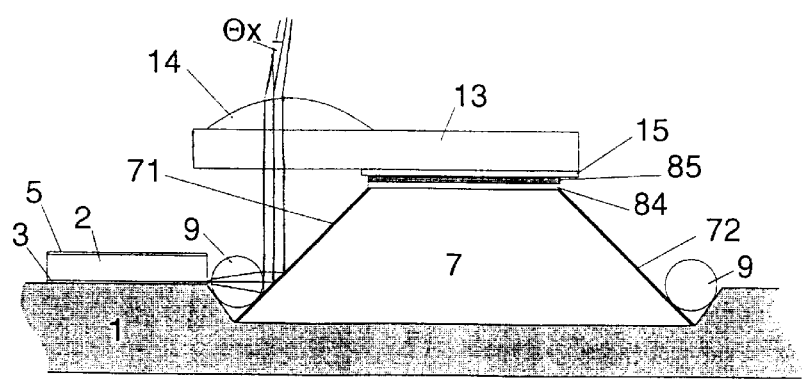

Image-forming optical devices are required for forming the strongly divergent laser beam of the laser diodes 2 into a weakly convergent beam for each laser diode. Commercially available high power laser diodes have a strongly elliptical remote field, which can. be converted by a cylindrical lens into a circularly symmetric remote field. The cylindrical lens must be aligned a slight distance from the laser diode and parallel to the long axis of the elliptical laser near field. As FIGS. 1 and 3 show, for all laser diodes 2 in a row a common shaped cylindrical lens 9 is used. A V-shaped groove is provided between a respective lateral wall of the depression 11 or 12 and its opposing inclined mirror surface 71, 72, 81, 82 on each side of the prismatic reflecting or mirror bodies 7 and 8. A cylindrical lens 9 for each of the four rows of lasers is placed and fixed in each V-shaped groove without adjustment. Special features can be provided for each cylindrical lens 9 in the supporting substrate 1 by known methods, e.g. anisotropic etching, according to the size, shape and position of the cylindrical lens. The focal length and aperture of each cylindrical lens 9 is selected so that the transformed beam of each laser diode has nearly the same divergence in the vertical direction as in the horizontal direction. The laser beams are transformed by the common cylindrical lens into nearly circularly symmetric beams which are only weakly divergent, impinge on one of the mirror surfaces 71, 72, 81, 82 and are deflected upward. A lens holder 13 with a spherical focusing lens 14 for each laser beam is mounted on the flat upper surface 73 or 83 of the prismatic reflecting body 7 or 8. The lens holder 13 rests with its flat portion on the upper surface 73 or 83 and another portion of the lens holder 13 extends over the mirror surface 71, 72, 81, 82 so that the individual laser beams pass through the focusing lenses 14(see the detailed FIGS. 3a and 3b). When the laser diode chips in adjacent rows are staggered with respect to each other, adjacent lens holders are alternately arranged extending either to the right or to the left, for spatial reasons, as shown in FIG. 1. In order to fix a lens holder 13 on the prismatic reflecting body 7 or 8 its flat upper surface 73 or 83 is provided with a metallized layer 84 and a solder layer 85. Similarly the bottom of the lens holder is provided with a solder-wetting layer 15 in the vicinity of the contacting region. Of course the solder layer can also be provided on the lens holder in other embodiments.

Figure 4:
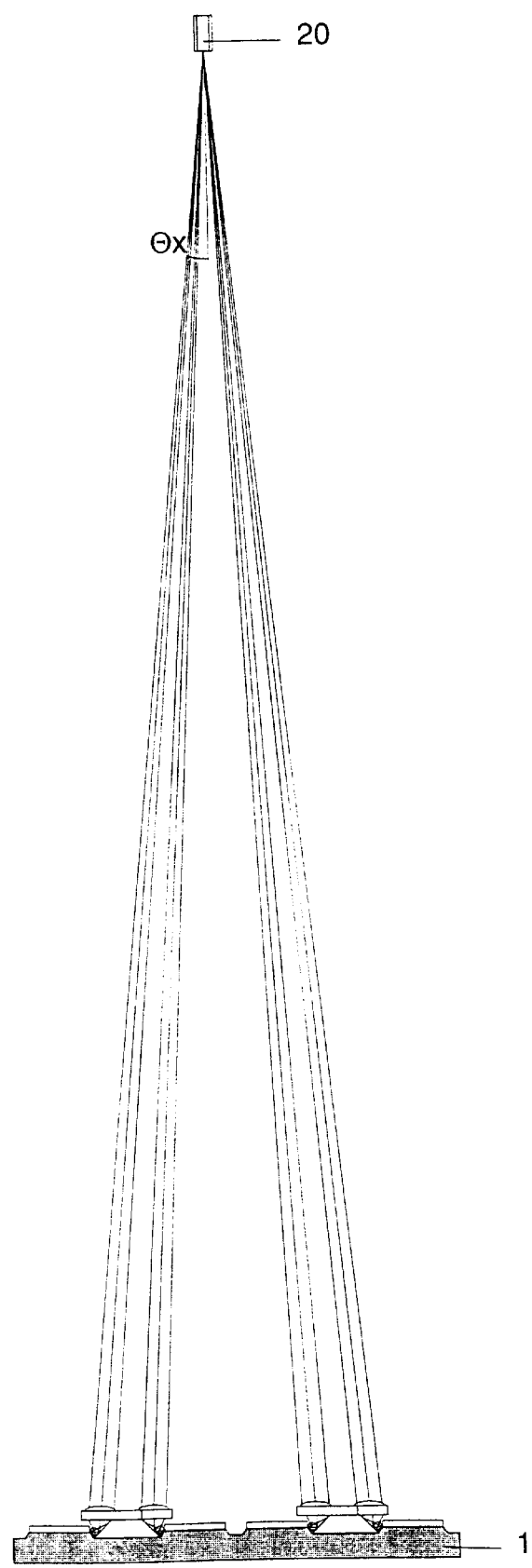
FIG. 4 is a top plan view of one embodiment of the arrangement according to the invention showing the entire laser beam paths.

The distance of the focusing lens 14 from the associated laser diode 2 and the focal length of the lens 14 are selected so that an enlarged image of the laser near field is formed a distance b from the lens 14 (see FIG. 4). A front surface of an optical fiber 20, especially a stepped profiled fiber with a core radius $r_k$, is mounted in the plane at a distance b in the propagation direction downstream from the lens 14. The focal length of the lens 14 alone together with separation $g_b$ between the lens 14 and the laser front surface of the laser diode 2 determine the magnification $V_p$ of the laser source in the plane parallel to the epitaxial layer of the laser diode. The size of the beam source in a vertical plane is determined by the cylindrical lens 9 and the lens 14 with the magnification $V_s$ in the same image plane at a spacing b from the lens 14. The magnifications $V_p$ and $V_s$ are selected so that the half axis of the image of the laser beam portion at the axis b from the lens 14 is smaller than the radius $r_k$ of the fiber 20. In this case the entire light from the laser diode 2 can be deflected into the optical fiber 20. So that light can be conducted into the fiber, the maximum input angle $\Theta_{max}$ cannot be greater than the acceptance angle $\Theta$ of the optical fiber 20. The maximum input angle $\Theta_{max}$ is determined from the image width and the maximum extent of the laser arrangement on the supporting substrate 1. If one selects an embodiment like that shown in FIG. 1 with four laser rows of seven laser diodes each, the upwardly guided rays issue from a surface of 4.4 mm×6.6 mm area. The greatest spacing $a_{max}$ of a ray from the surface center is then $$a_{max} = \tfrac{1}{2} \times (4.4^2 + 6.6^2)\ \text{mm} = 4\ \text{mm}.$$

The acceptance angle of a stepped profile optical fiber with a numerical aperture of NA=0.2 and a core radius of $r_k$=100 μm is given by $$\Theta = \arcsin(NA) = 11.5°.$$

The image width b must amount to at least $$b_{min} = 4\ \text{mm}/\tan(11.5°) = 20\ \text{mm},$$

in this case.

The beam or the rays of the beam can be deflected by a small angle $\Theta_x$ (FIG. 3b) and a small angle $\Theta_y$ in the x and y directions (FIG. 3a) respectively. Thus the beam of each individual pumping laser diode may be directed into the core of the optical fiber 20. In this way the lens 14 of all pumping laser diodes can be individually adjusted one after the other. The lens holders 13 are movable laterally on the upper surface 73 or 83 of the reflecting body 7 or 8, preferably by an automatic adjusting system, while the light power coupled into the optical fiber is measured. The laser diode, whose beam is being adjusted, is contacted with contacting needles on the neighboring contacting surfaces 3. Instead of the optical fiber 20 a CCD camera without objective and with a beam diagnostic system can be mounted at the position of the optical fiber 20 during the adjustment process. This type of adjusting system is in a position to determine the position of the center of gravity of the light distribution on the camera chip The position coordinates can be used directly for control of the lens positioning, so that the adjusting process can be performed without extensive searching processes.

Figure 5:
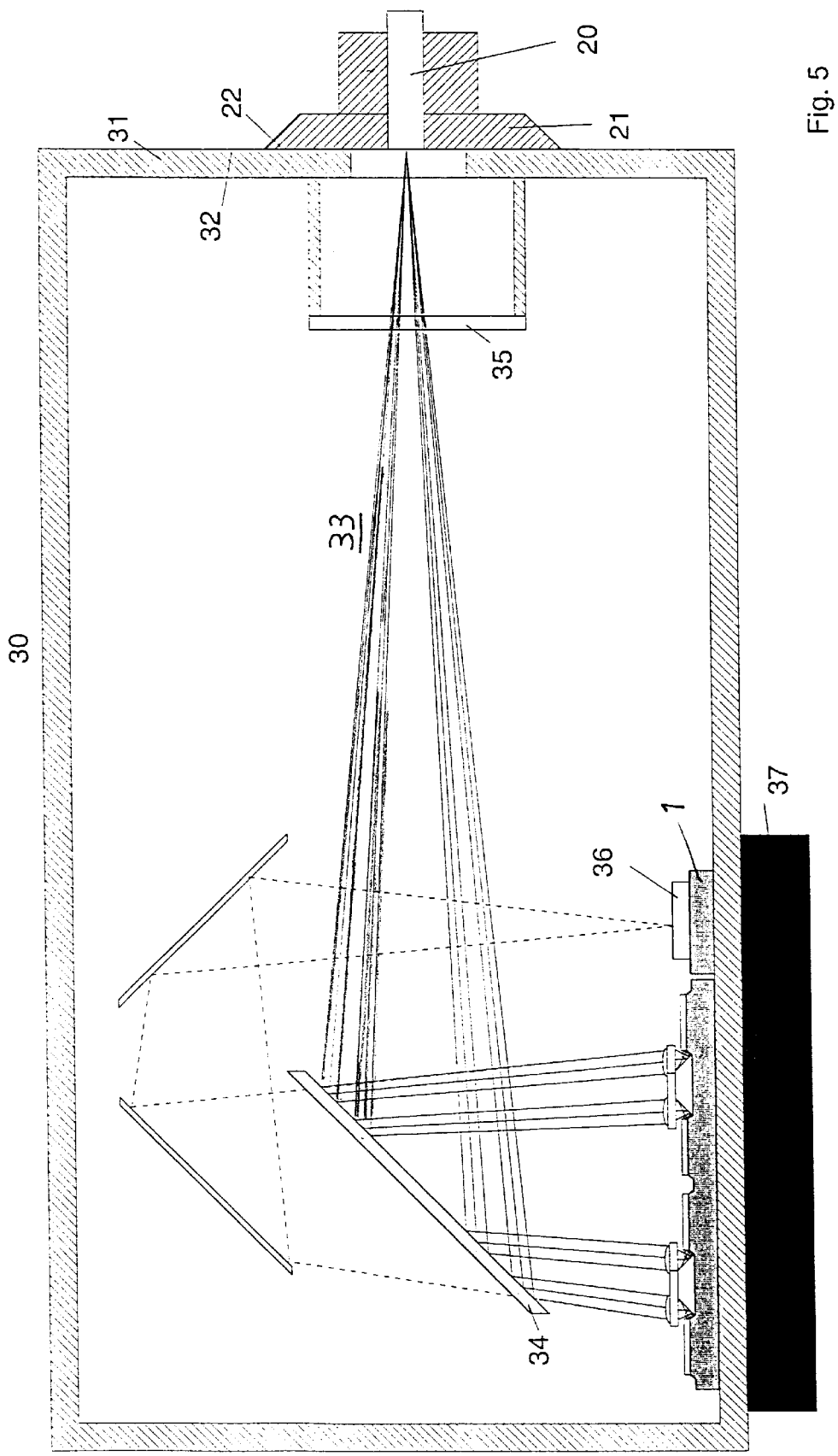
FIG. 5 is a plan view of another embodiment of an arrangement of according to the invention in a hermetically sealed housing with optical fiber connectors.

FIG. 5 shows the arrangement according to the invention accommodated in a common hermetically sealed housing 30 with fiber optic connectors. The optical fiber 20 is inserted in a flange 21 with a planar flange surface 22. The housing 30 similarly has a planar flange surface 32 on its opposite surface 31. The entire light beam including all individual rays or beams is deflected about 90° with a mirror 34 in the embodiment shown in FIG. 5. This has the advantage that the optical fiber 20 can be guided parallel to the bottom surface of the supporting substrate 1 and thus the entire arrangement takes up less space. A window 35 on the light outlet in the wall 31 provides the hermetically sealed closure of the housing 30. When the deflecting mirror 34 transmits some light (although a small amount in comparison to the proportion of light reflected), the transmitted light can be used as a monitor signal for the entirety of all the pumping laser diodes. In the embodiment according to FIG. 5 this transmitted light is deflected to a monitor diode 36. A heat sink 37 is mounted under the housing bottom under the supporting substrate 1 to conduct away the dissipated heat.

The position of the mirror 34 and the laser arrangement is chosen so that the focal point of the entire light beam 33 falls on the flange plane of the flange surface 32 or 22 and thus on the facing or front surface of the optical fiber 20. Mounting tolerances of the mirror 34 may then be compensated by an active lateral adjustment of the flange 21 in the plane 32 during operation of all pumping laser diodes according to the entire light signal. The light coupled into the optical fiber 20 can now be guided into the pumping light coupling position of the solid state laser to be pumped.

The disclosure in German Patent Application 198 38 518.8 of Aug. 25, 1998 is incorporated here by reference. This German Patent Application describes the invention described hereinabove and claimed in the claims appended hereinbelow and provides the basis for a claim of priority for the instant invention under 35 U.S.C. 119.

While the invention has been illustrated and described as embodied in a arrangement for aligning the. light beam paths of a group of laser diodes on a common spot, especially for providing pumping light for a solid state laser, it is not intended to be limited to the details shown, since various modifications and changes may be made without departing in any way from the spirit of the present invention.

Without further analysis, the foregoing will so fully reveal the gist of the present invention that others can, by applying current knowledge, readily adapt it for various applications without omitting features that, from the standpoint of prior art, fairly constitute essential characteristics of the generic or specific aspects of this invention.

What is claimed is new and is set forth in the following appended claims:

1. An arrangement for focussing a combined laser beam (33) on a common spot on a plane surface (32,22), said combined laser beam (33) comprising individual laser beams produced by a plurality of laser diodes (2), wherein said arrangement comprises a common supporting substrate (1) on which said laser diodes (2) are mounted;

means (7,8) for providing a bend in a beam path of each of said individual laser beams;

at least one cylindrical lens (9) mounted on said common supporting substrate (1) and arranged between each of said laser diodes (2) and said bend in said beam path;

a respective focusing lens (14) provided in said beam path of each of said individual laser beams and mounted on said common supporting substrate (1) between said bend in said beam path and said common spot so that said respective focusing lens (14) is laterally movable in order to adjust said individual laser beams one after the other;

whereby said individual laser beams converge to said common spot on said plane surface and said combined laser beam (33) is focussed on said common spot.

2. The arrangement as defined in claim 1, further comprising means for adjusting said individual laser beams to converge on said common spot and wherein said means for adjusting said individual laser beams includes a CCD camera without objective and said CCD camera is positionable at said common spot on said plane surface to receive said combined laser beam during the adjusting in order to determine a center of gravity of a light distribution of said combined laser beam.

3. The arrangement as defined in claim 1, wherein said means for providing said bend in said beam path comprise a plurality of prismatic reflecting bodies (7,8) provided with oppositely inclined reflecting surfaces (71,72,81,82) on opposite sides thereof, said prismatic reflecting bodies (7,8) being arranged on said common supporting substrate (1) so that said individual laser beams are deflected by said reflecting surfaces.

4. The arrangement as defined in claim 3, wherein depressions (11,12) are provided in said common supporting substrate (1) beside said laser diodes (2), said prismatic reflecting bodies (7,8) are arranged in said depressions and said at least one cylindrical lens (9) is arranged between said laser diodes and said prismatic reflecting bodies (7,8).

5. The arrangement as defined in claim 4, wherein said depressions are formed by etching the common supporting substrate (1).

6. The arrangement as defined in claim 4, wherein said prismatic reflecting bodies (7,8) are arranged on a bottom of said depressions (11,12) or on a step inside of said depressions.

7. The arrangement as defined in claim 1, further comprising an optical fiber (20) having an end with a front surface thereon and wherein said common spot is located on said front surface of said optical fiber (20).

8. The arrangement as defined in claim 7, further comprising a hermetically sealed housing (30) including a wall (31) and wherein said common supporting substrate (1), said laser diodes (2), said cylindrical lenses (9) and said focusing lenses (14) are contained within said housing and said optical fiber (20) extends through said wall (31) of said housing.

9. An arrangement for focussing a combined laser beam (33) on a common spot on a plane surface (32,22), said combined laser beam (33) comprising a plurality of individual laser beams each having an elliptical remote field, wherein said arrangement comprises a common supporting substrate (1);

a plurality of laser diodes (2), each of said laser diodes generating a respective one of said individual laser beams, wherein said laser diodes (2) are arranged in parallel rows (R1,R2, R3,R4) on said common supporting substrate (1);

at least one prismatic reflecting body (7,8) arranged in at least one depression (11,12) respectively provided in said common supporting substrate (1), each of said at least one prismatic reflecting body having oppositely inclined reflecting surfaces (71,72; 81;82) arranged on opposite sides thereof, wherein respective rows (R1, R2; R3,R4) of said laser diodes (2) are arranged on said opposite sides of each of said at least one prismatic body, so that said individual laser beams from said respective rows of said laser diodes are deflected by said reflecting surfaces (71,72; 81,82);

respective cylindrical lenses (9) mounted in said common supporting substrate (1) and arranged on said opposite sides of each of said at least one prismatic reflecting body (7,8) and between said laser diodes (2) and said reflecting surfaces (71,72; 81,82) so that said individual laser beams pass through corresponding ones of said cylindrical lenses (9) prior to deflection by said reflecting surfaces in order to convert said elliptical field of each of said laser beams into a circularly symmetric field; and respective focusing lenses (14) for said individual laser beams, said respective focusing lenses (14) being mounted on said at least one prismatic reflective body (7,8) and arranged between said reflecting surfaces and said common spot so that said respective focusing lenses (14) are individually laterally movable to adjust said individual laser beams one after the other;

whereby said combined laser beam (33) is focussed on said common spot.

10. The arrangement as defined in claim 9, further comprising means for adjusting said individual laser beams to converge on said common spot and wherein said means for adjusting said individual laser beams includes a CCD camera without objective and said CCD camera is positionable at said common spot to receive said combined laser beam during the adjusting in order to determine a center of a light distribution produced by said combined laser beam.

11. The arrangement as defined in claim 9, further comprising a hermetically sealed housing (30) including a wall (31) and an optical fiber (20) having an end surface, and wherein said common supporting substrate (1), said laser diodes (2), said cylindrical lenses (9) and said focusing lenses (14) are contained within said housing and said optical fiber (20) extends through said wall (31) of said housing so that said common spot is on said end surface.

12. The arrangement as defined in claim 9, wherein two prismatic reflecting bodies (7,8) are arranged on said common supporting substrate (1), each of said two prismatic reflecting bodies (7,8) is accommodated in a respective one of two depressions (11,12) provided in said common supporting substrate (1) and each of said two prismatic reflecting bodies (7,8) is located between adjacent ones of said parallel rows (R1,R2; R3,R4) of said laser diodes (2).

* * * * *